United States Patent [19]
Matern

[11] Patent Number: 5,637,835
[45] Date of Patent: Jun. 10, 1997

[54] AUTOMATIC TEST DETECTION OF UNSOLDERED THRU-HOLE CONNECTOR LEADS

[75] Inventor: Michael L. Matern, Plympton, Mass.

[73] Assignee: The Foxboro Company, Foxboro, Mass.

[21] Appl. No.: 451,954

[22] Filed: May 26, 1995

[51] Int. Cl.⁶ .................................................. H05K 1/00
[52] U.S. Cl. .................... 174/266; 174/263; 174/260; 361/778; 361/777; 29/837; 29/839
[58] Field of Search .................................. 174/262, 261, 174/260, 266, 263; 361/778, 777, 767; 29/840, 837, 839

[56] References Cited

U.S. PATENT DOCUMENTS

| | | | |
|---|---|---|---|
| 4,091,529 | 5/1978 | Zaleckas | 29/628 |
| 4,225,900 | 9/1980 | Ciccio et al. | 361/395 |
| 4,413,309 | 11/1983 | Takahashi et al. | 361/406 |
| 4,613,924 | 9/1986 | Brault | 361/403 |
| 4,646,204 | 2/1987 | Brauer | 361/403 |
| 4,835,345 | 5/1989 | Haarde | 174/68.5 |
| 5,062,567 | 11/1991 | Nishihara et al. | 228/105 |
| 5,092,033 | 3/1992 | Nishiguchi et al. | 29/840 |
| 5,227,589 | 7/1993 | Weeks | 174/263 |
| 5,243,143 | 9/1993 | Throop et al. | 174/263 |
| 5,308,928 | 5/1994 | Parla | 174/261 |
| 5,311,405 | 5/1994 | Tribbey et al. | 361/767 |
| 5,342,999 | 8/1994 | Frei et al. | 174/266 |

*Primary Examiner*—Laura Thomas
*Attorney, Agent, or Firm*—Clare Hartnett; Jules Jay Morris

[57] ABSTRACT

A method and apparatus providing an automated means for detecting unsoldered thru-hole connector leads is herein disclosed. This means consists of a thru-hole connection pad and a test pad positioned in close proximity to each lead of an electrical component. A thru-hole connection pad is formed about the periphery of each thru-hole. It serves to form a solder pad for securing the lead to the printed circuit board and establishes an electrical connection between the component and reverse sides of the printed circuit board. A test etch easily accessible by an automated testing device is positioned within close proximity of each thru-hole connection pad. As each lead is individually soldered to the printed circuit board, a solder bridge must also be formed across the thru-hole connection pad and the test etch thereby establishing an electrical connection between the lead and the test etch. This electrical connection is used by an automated testing device to detect any unsoldered leads. The design of the thru-hole connection pad and test etch can be embodied in various geometric shapes and sizes. However, the emphasis is placed on a design that requires minimal space on the printed circuit board and which preserves the integrity of the existing circuitry.

17 Claims, 5 Drawing Sheets

AUTOMATIC TEST DETECTION OF UNSOLDERED THRU-HOLE CONNECTOR LEADS

BACKGROUND

1. Technical Field

This invention relates to the manufacture of circuit boards, more particularly, for a method and apparatus for automatic verification of solder joints of thru-hole mounted electronic components.

2. Background Art

The technological advances made in semiconductor processing has increased the density of electronic components in printed circuit boards. This has led to the predominance of surface mounted devices in printed circuit boards. For various reasons, certain devices do not lend themselves to surface mount technology. Examples of such devices include thru-hole components such as connectors, resistors, switches, and LEDs. This has led to the practice of utilizing thru-hole components in combination with surface mounted devices.

However, this combined technology circuit board presents additional problems. First, the thru-hole components are often manually soldered to the printed circuit board which makes their mechanical and electrical connections susceptible to error. Occasionally, joints are left unsoldered which may be difficult or impossible to detect. For example, an unsoldered connector lead that has a loose mechanical fit can provide an electrical connection under certain conditions and none at other times. This error may be difficult to detect since an intermittent electrical connection may be present when the component's functionality is tested.

Second, automatic testing techniques typically test the electronic functionality of the component. Automatic testing techniques are more desirable since they are faster than manual testing techniques, more efficient, and thereby cost effective. Thru-hole components on a surface mounted circuit board cannot fully utilize this type of testing since it requires verifying the solder connection of each lead in addition to the electrical connection. This is not performed since there is no mechanism which can test the solder connection of each lead in an automated manner.

This problem is illustrated by the prior art printed circuit board configurations shown in FIGS. 3 and 4. FIG. 3 illustrates the reverse side of a typical printed circuit board and FIG. 4 illustrates the corresponding opposite component side. Referring to FIGS. 3 and 4, the printed circuit board 14 has thru-holes, 10a through 10h, used to mount thru-hole components. These components are assembled onto the board by inserting the component leads into the thru-holes which extend from the component side of the board through to the reverse side. The leads are mechanically and electrically connected to the circuit board by individually soldering each lead projecting through its designated thru-hole with solder fill such as electronic tin/lead solder. As this process is performed individually, the reliability that each lead has been soldered is low.

The board contains various test pads 12a thru 12f which provide an automated means for testing electrical connections between various devices and for testing the component's functionality. However, there is no automated mechanism for testing for the presence of or mechanical stability of the solder joints of the individual connector leads. An unsoldered lead may go undetected if it does not affect the electrical functionality of the tested components at the time it is tested. Accordingly, there exists an improved technique for automatically detecting unsoldered thru-hole component leads.

It is an object of this invention to provide an automatic testing technique for detecting unsoldered thru-hole component leads.

It is a further object of this invention to provide a technique as described above which does not significantly increase the cost of the printed circuit board yet increases the quality assurance of the finished assembly.

It is a further object of this invention to provide a technique as described above which does not affect the existing circuit integrity.

Other general and specific objects and advantages of this invention will be apparent and evident from the accompanying drawings and the following description.

SUMMARY OF THE INVENTION

A method and apparatus providing an automated means for detecting unsoldered thru-hole connector leads is herein disclosed. This means consists of a thru-hole connection pad and a test etch positioned in close proximity to each lead of an electrical component. A thru-hole connection pad is formed about the periphery of each thru-hole. It serves to form a solder pad for securing the lead to the printed circuit board and establishing an electrical connection to the board circuitry. A test etch easily accessible by an automated testing device is positioned within close proximity of each thru-hole connection pad. As each lead is individually soldered to the printed circuit board, a solder bridge must also be formed across the thru-hole connection pad and the test etch thereby establishing an electrical connection between the lead and the test etch. This electrical connection is used by an automated testing device to detect any unsoldered leads.

The design of the thru-hole connection pad and test etch can be embodied in various geometric shapes and sizes. However, the emphasis is placed on a design that requires minimal space on the printed circuit board and which preserves the integrity of the existing circuitry. In the first embodiment, the thru-hole connection pad circumscribes the outer periphery of the thru-hole. The test etch is positioned concentric about the thru-hole thereby enabling a solder bridge to be formed across the thru-hole connection pad to the test pad at any point. In the second embodiment, the thru-hole connection pad contains a rectangular edge which is parallel to the diameter of the thru-hole. The test etch also contains a rectangular edge which is positioned parallel to the rectangular edge of the thru-hole connection pad and within a uniform distance. This design requires less space than the previous embodiment and enables a solder bridge to be formed across the thru-hole connection pad to the test etch at certain points.

BRIEF DESCRIPTION OF THE DRAWINGS

The foregoing and other objects, features and advantages of the invention will be apparent from the following more particular description of the preferred embodiment of the invention, as illustrated in the accompanying drawings in which like reference characters refer to the same elements throughout the different views. The drawings are not to scale, emphasis being placed on illustrating the principles of the invention.

DESCRIPTION OF THE ILLUSTRATED EMBODIMENT

A method and apparatus for providing an automated means for detecting unsoldered thru-hole connector leads is herein disclosed.

Figure 1:
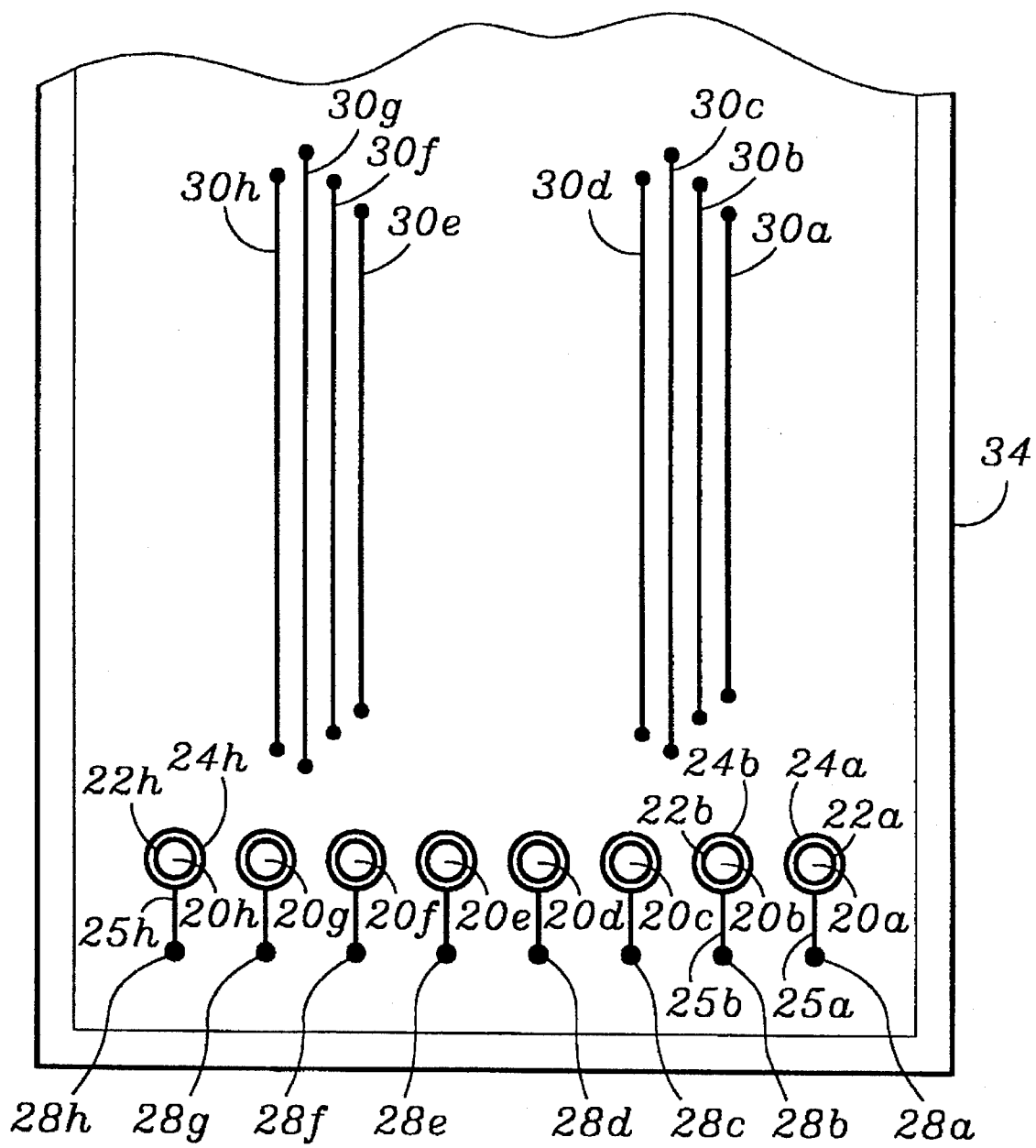
FIG. 1 is a top view of the reverse side of a printed circuit board manufactured in accordance with the present invention.
Figure 2:
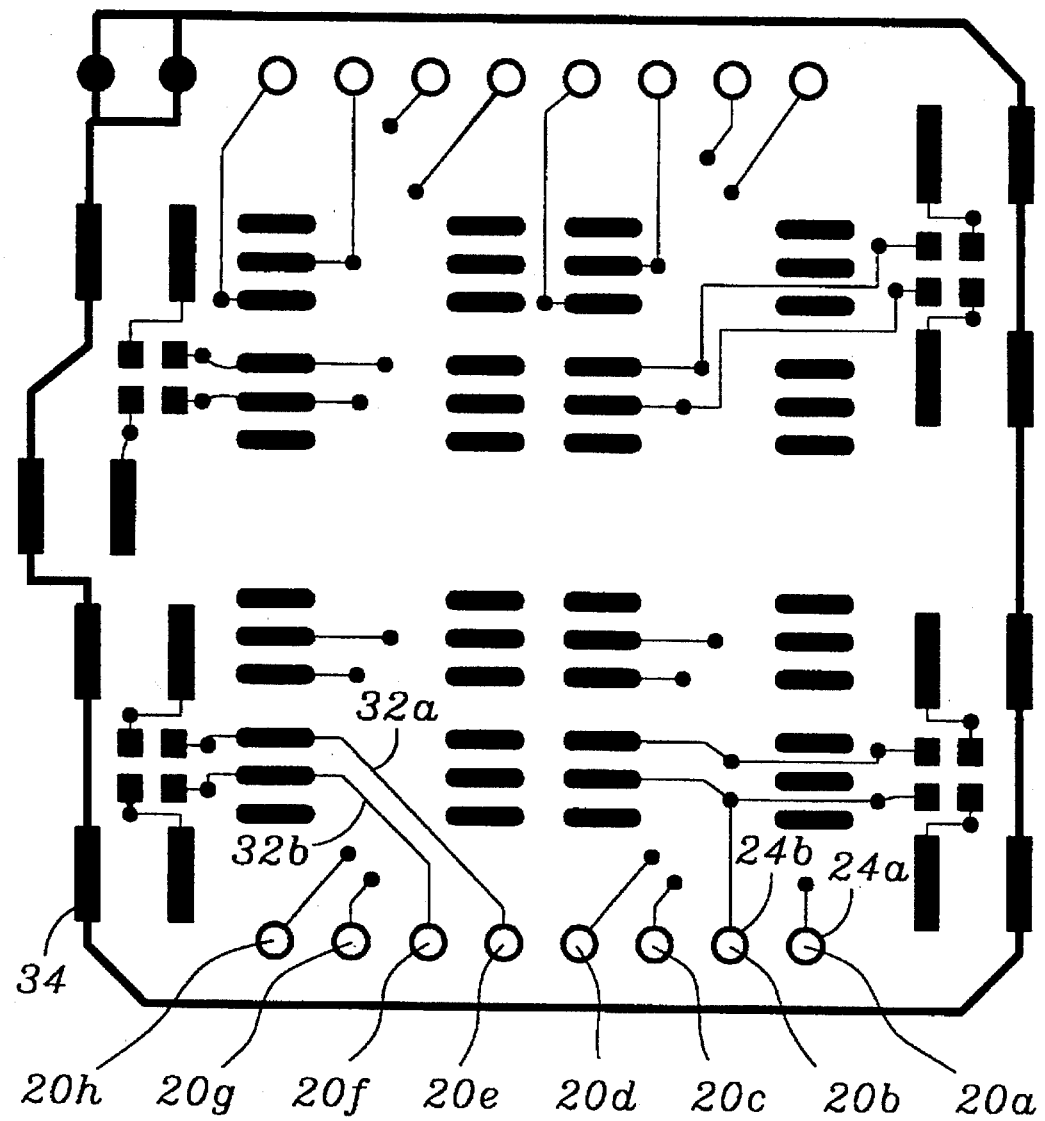
FIG. 2 is a top view of the component side of a printed circuit board manufactured in accordance with the present invention.
Figure 3:
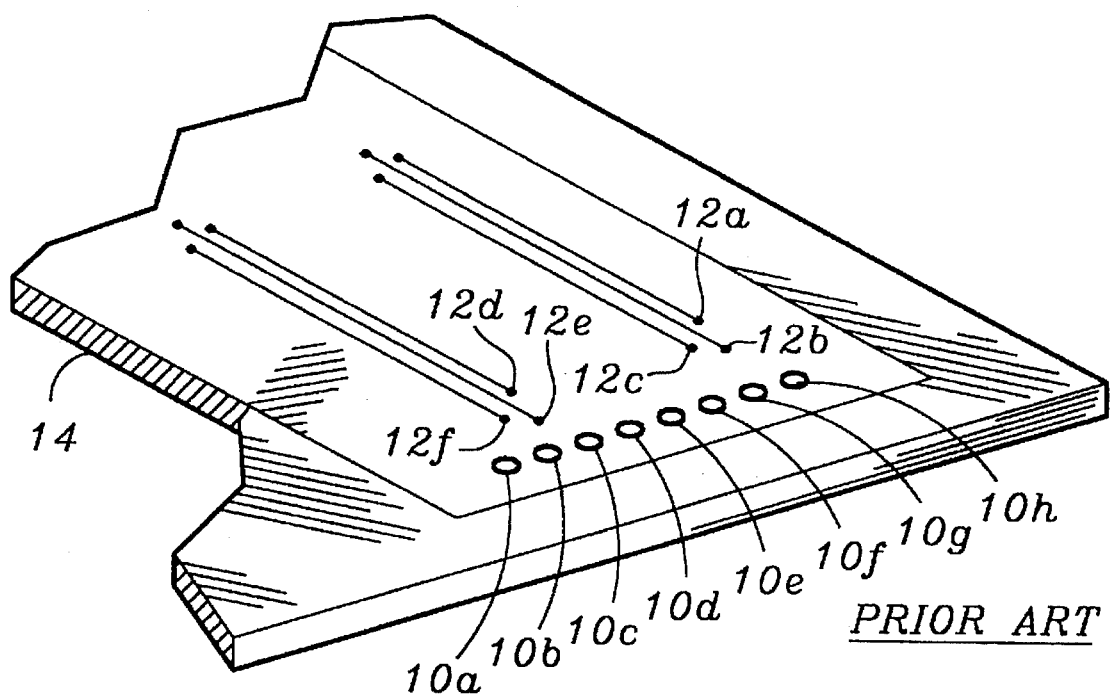
FIG. 3 is a top view of the reverse side of a printed circuit board representative of the prior art.
Figure 4:
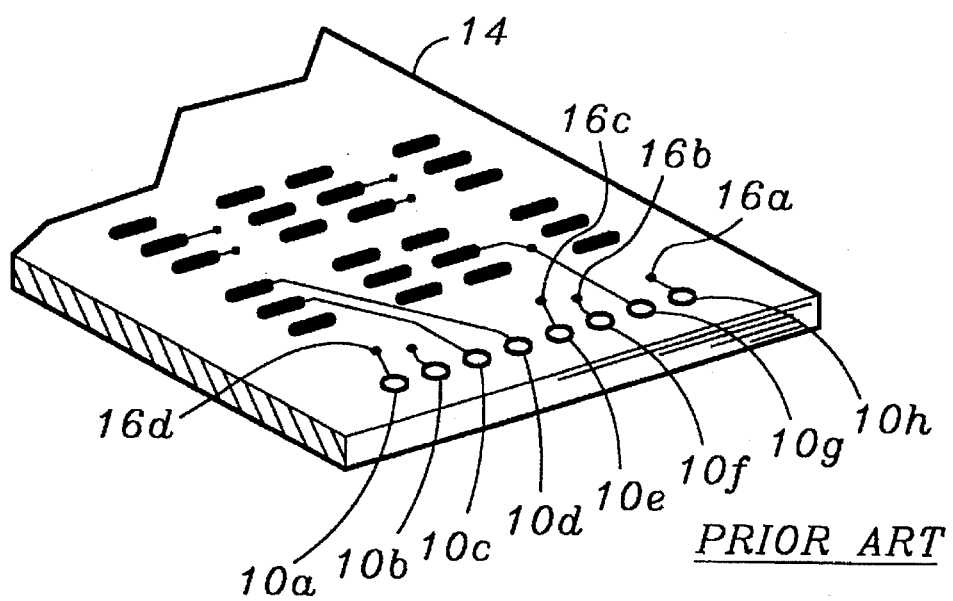
FIG. 4 is a top view of the component side of a printed circuit board representative of the prior art.

FIGS. 1 and 2 illustrate a printed circuit board built in accordance with the present invention. FIG. 1 depicts the reverse side of a printed circuit board and FIG. 2 depicts the opposite corresponding component side. Referring to FIGS. 1 and 2, printed circuit board 34 contains a row of thru-holes 20a thru 20h, extending through the interior of the printed circuit board. Thru-holes 20a through 20h can be formed of a conductive material, such as copper, covered with a layer of solder, such as lead-tin alloy, silver or the like. The thru-holes are used to house the leads of an electrical component and when soldered with conductive solder mount and secure the electrical component to the printed circuit board. The conductive material which coats the thru-holes is used to make electrical contact with the lead and other electrical components or conductive traces on either side of the board.

The thru-holes 20a thru 20h are typically spaced apart from each other by a distance dependent on usage which varies in accordance with the component size. Thru-holes 20a thru 20h are used to make electrical contact from the reverse side to the component side and can be connected to conductive traces, 30a thru 30h and/or 32a thru 32b, on either side of the printed circuit board. The number of thru-holes varies and is dependent on the number of leads of the component to be mounted. Thru-holes 20a thru 20h can be circular and preferably of a diameter slightly larger than the component lead to be mounted. However, the invention is not limited to this choice of shape or size. Others may be used which may depend on the component type.

Figure 5:
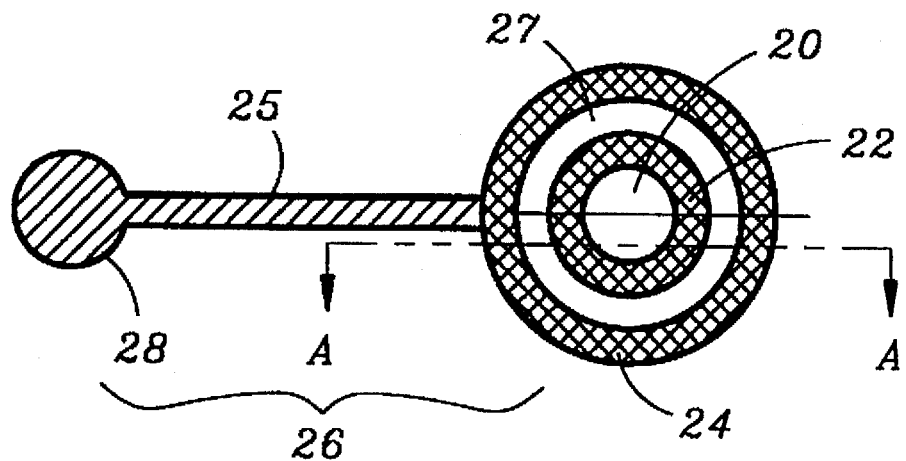
FIG. 5 is an enlarged view of the test etch and thru-hole designed in accordance with the present invention.

FIG. 5 is an enlarged view of one of the thru-holes as seen from the reverse side of the printed circuit board. Referring to FIGS. 1 and 5, each thru-hole has a thru-hole connection pad 22 surrounding the periphery of the thru-hole on the surface of the reverse side of the printed circuit board. Thru-hole connection pad 22 can be formed of a conductive material, such as copper covered with a layer of solder. The thru-hole connection pad 22 can provide an electrical connection from the component side of the printed circuit board to an electrical trace pattern. It can also serve as a solder pad for soldering the lead to the printed circuit board. Thru-hole connection pad 22 can be circular but is not limited to a particular geometric shape. Its shape is determined by the outer periphery of the thru-hole. The diameter of the thru-hole connection pad is dependent on the size of the lead. A thru-hole connection pad 22 of a similar shape and size can be found on the component side of the printed circuit board (see FIG. 2).

A test etch 26 is positioned within close proximity to thru-hole component pad 22 of each thru-hole. Test etch 26 can be used by an automatic testing device to test the electrical connection between the lead and the test etch once the lead is soldered to the printed circuit board. The existence of this electrical connection would indicate that the lead is properly soldered to the printed circuit board. In the first embodiment, test etch 26 can be composed of ring 24, conductive trace 25, and test pad 28. Ring 24 serves to form an electrical connection from the soldered lead to test etch 26. Ring 24 can be circular and concentric surrounding thru-hole connection pad 22 but is not limited to any particular geometric shape. Rather the shape is dependent of the shape of the thru-hole and such that it is concentric about the thru-hole. Ring 24 can be formed of a conductive material such as copper covered with a layer of solder.

The distance between rings 22 and 24 should provide for a minimal annulus of non-conductive material 27 constructed according to standard circuit board manufacturing techniques. Annulus 27 is formed of insulating material such as conventional circuit board material. The thinner annulus 27 is the easier it is to form the conductive solder bridge during component installation, however, it must be wide enough to reliably electrically isolate the two rings 22, 24 before soldering. Annulus 27 is no more than 0.030 inches, preferably between 0.005–0.006 inches. However, the invention is not constrained to any particular size. Instead, the choice of size is based on manufacturing considerations such as cost of manufacture and the ease in forming a solder bridge.

The cross section of ring 24 is at least 0.005 inches which is large enough to form a solder bridge while not requiring a large amount of circuit board space. A width between 0.0125–0.015 inches is preferred however the invention is not constrained to any particular size. Instead, the emphasis is placed on conserving circuit board space and the ease in forming a solder bridge.

Test etch 26 contains a test pad 28 which is used by a conventional automatic testing device to detect electrical connections. Typically, conventional automatic testing devices test electrical connections relative to two test pads. Test pad 28 can be of a circular shape having a diameter of at least 0.015 inches, and formed of a conductive material such as copper covered with a layer of solder. However, it need not be limited to this geometric shape and size. Other shapes may be used so long they are suitable for the automatic testing device employed. Test pad 28 is connected to ring 24 by means of conductive trace 25 which serves to electrically connect ring 24 to test pad 28. Conductive trace 25 need not be of any particular geometric shape or size but serves to provide the minimum connection needed to form the electrical connection between ring 24 and test pad 28. Using standard printed circuit board technology, conductive trace 25 can be formed of a conductive material such as copper covered with a layer of nonconductive material. This is to ensure that solder does not form about conductive trace 25 during the soldering process.

An electrical component having leads is placed onto the printed circuit board from the component side with the leads positioned into the respective thru-holes. Each lead is then soldered to the board with solder fill thereby securing the lead to the printed circuit board. Typically, a good solder connection will result in solder flowing so that a solder bridge is formed across thru-hole connection pad 22 and ring 24 due to their close spacing thereby electrically connecting the lead to test etch 26. This additional soldering step may require a slight increase in the manufacturing time of the printed circuit board but provides a connection between test etch 26 and the lead thereby enabling the individual lead to be tested by an automatic testing device using test pad 28. This test will detect the presence of any unsoldered leads.

Figure 6:
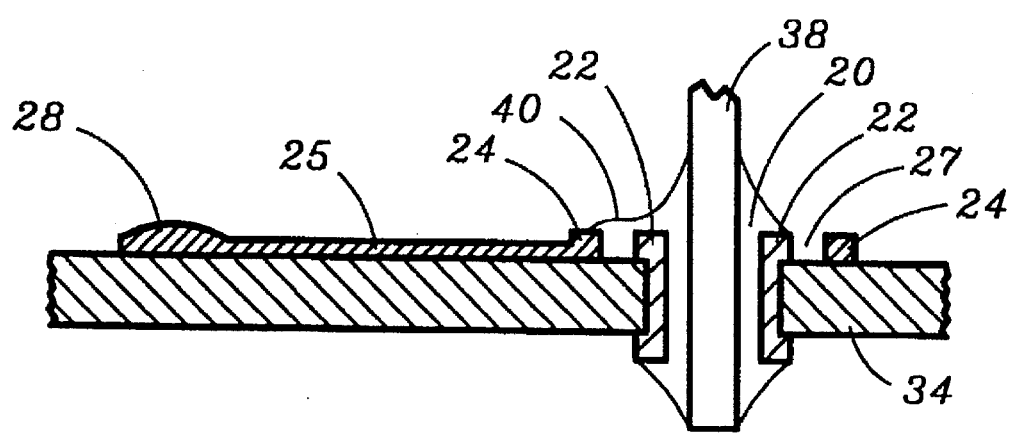
FIG. 6 is a cross-sectional view of a soldered thru-hole component lead utilizing the test etch depicted of FIG. 5 taken along section A—A.

FIG. 6 depicts the solder bridge formed across thru-hole connection pad 22 and ring 24. Lead 38 is fitted into thru-hole 20, soldered to thru-hole connection pad 22, and then soldered across to ring 24 with solder fill material. This establishes a solder bridge 40 from lead 38 to ring 24 and an electrical connection from lead 38 to test pad 28 via trace 25. In soldering the lead to the circuit board, lead 38 is first soldered to thru-hole connection pad 22 and then a solder bridge is formed across to test etch 26. The solder bridge is not constrained to being formed at any particular point between thru-hole component pad 22 or ring 24 and may connect the two rings for the entire 360 degrees. Rather the emphasis is placed on the solder bridge making an electrical connection from the lead to ring 24. Test pad 28 can then be used by an automatic testing device to detect whether the electrical connection exists and hence whether the lead has been properly soldered.

Figure 7:
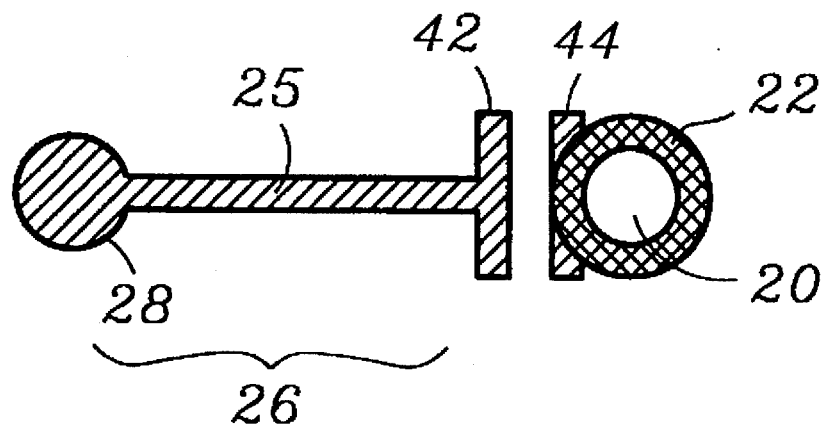
FIG. 7 is a top view of the second embodiment of the test etch.

The physical design of the test pad is not limited to the design shown in FIG. 6. Alternate designs can be considered as long as they provide an electrical connection within close proximity to the thru-hole and provide a test point which can be utilized by an automatic testing device. FIG. 7 illustrates one such alternate embodiment.

FIG. 7 depicts the second embodiment of the invention. In this embodiment, the test etch does not contain a circular ring concentric about the thru-hole connection pad. Instead the test etch consists of a rectangular edge positioned parallel to the diameter of the thru-hole. This embodiment may be preferable for tightly spaced boards which may not have the additional space required for a concentric test pad. Referring to FIG. 7, there is a thru-hole connection pad 22 positioned about the periphery of thru-hole 20. Test etch 26 can consist of test pad 28, conductive trace 25, and rectangular bar 42. Test pad 28 and conductive trace 25 can be similar to these elements in the first embodiment. Rectangular edge 42 can be positioned parallel to the diameter of thru-hole connection pad 22 within a distance of no more than 0.030 inches, preferably between 0.005–0.006 inches. This distance is chosen to be the minimum distance to electrically isolate test etch 26 from ring 22 while being small enough to easily form a solder bridge. Rectangular edge 42 can be of a length equivalent to the combined diameter of both thru-hole connection pad 22 and thru-hole 20. However, the invention is not limited to this specific geometric shape and size. Others may be used so long as the identical functionality is provided.

The structure of thru-hole connection pad 22 differs from the first embodiment. Thru-hole connection pad 22 can contain a rectangular edge 44 parallel to the diameter of the thru-hole. This design provides a uniform distance between test etch 26 and thru-hole connection pad 22 which is important for constructing a solder bridge with ease. It also may be preferred for tightly spaced boards not having the additional space required for a concentric test etch.

Referring again to FIG. 7, a component lead is placed into one of the thru-holes 20 and manually soldered with solder fill to secure the lead to the circuit board and to form a solder bridge across edge 44 of component test pad 22 and edge 42 of test pad 26. The formation of the solder bridge is not constrained to being placed in any specific position. Rather, the emphasis is placed on an electrical connection being formed from the lead to the closest part of the test etch 26, which is edge 42. The function of the solder bridge is to form an electrical connection from the lead to test etch 26 thereby enabling an automatic testing device to detect the presence of an unsoldered lead from test pad 28.

The aforementioned disclosure presents a method and apparatus providing an automated means for detecting unsoldered thru-hole connector leads. This means consists of a thru-hole connection pad and a test etch positioned in close proximity to each lead of an electrical component. A thru-hole connection pad is formed about the periphery of each thru-hole. It serves to form a solder pad for securing the lead to the printed circuit board and establishes an electrical connection between the component and reverse sides of the printed circuit board. A test etch easily accessible by an automated testing device is positioned within close proximity of each thru-hole connection pad. As each lead is individually soldered to the printed circuit board, a solder bridge must also be formed across the thru-hole connection pad and the test etch thereby establishing an electrical connection between the lead and the test etch. This electrical connection is used by an automated testing device to detect any unsoldered leads. The design of the thru-hole connection pad and test etch can be embodied in various geometric shapes and sizes. However, the emphasis is placed on a design that requires minimal space on the printed circuit board and which preserves the integrity of the existing circuitry.

Although the preferred embodiment of the invention has been described hereinabove in detail, it is desired to emphasize that this is for the purpose of illustrating the invention and thereby to enable those skilled in this art to adapt the invention to various different applications requiring modifications to the apparatus described hereinabove; thus, the specific details of the disclosures herein are not intended to be necessary limitations on the scope of the present invention other than as required by the prior art pertinent to this invention.

I claim:

1. A circuit card for mounting thereon electronic components having leads, comprising:
   (a) a first side;
   (b) a second side being opposite of said first side;
   (c) a plurality of thru-holes extending through said card between said first and second sides thereof, said thru-holes being adapted to secure said leads of thru-hole components to said electronic card;
   (d) a plurality of thru-hole connection pads formed on said circuit card about the periphery of each of said thru-holes, said thru-hole connection pads providing an electrical connection from said first side to said second side; and
   (e) a plurality of test etches, each test etch being associated with a respective one of said thru-holes, said test etches being positioned within a distance of less than about 0.030 inches of said respective thru-hole connection pad and initially electrically isolated therefrom and being adapted for forming an electrical connection from a component lead after said lead is soldered to said thru-hole connection pad to electrically connect it to said test etch.

2. The circuit card of claim 1, wherein said test etches are positioned parallel to a diameter of said thru-hole.

3. The circuit card of claim 2, further including a test pad accessible by an automatic testing device for use in testing the electrical connection.

4. The circuit card of claim 1, each of said thru-hole connection pads further comprising a first rectangular edge tangent to a diameter of said thru hole, and wherein said test etches further include a second rectangular edge positioned parallel to said first rectangular edge of said thru-hole connection pad.

5. The circuit card of claim 4, further including a test pad accessible by an automatic testing device for use in testing the electrical connection.

6. The circuit card of claim 1, further including a test pad accessible by an automatic testing device for use in testing the electrical connection.

7. A circuit card, comprising:
   a) a component side for mounting electrical components;
   b) a reverse side being opposite of said component side;
   c) a plurality of thru-holes extending through said card between said component and reverse sides thereof, said thru-holes used to secure said leads of thru-hole components to said circuit card;
   d) a plurality of thru-hole connection pads formed on said circuit card about the periphery of each of said thru-holes, said thru-hole connection pads providing an electrical connection from said component side to said reverse side; and
   e) a plurality of test etches, each test etch being associated with one of said thru-holes, said test etches being positioned within a distance of less than about 0.030 inches of said thru-hole connection pad and used for forming an electrical connection from a component lead soldered to said thru-hole connection pad to said test etch, wherein each of said test etches is positioned concentric to a respective one of said thru-hole connection pads.

8. The circuit card of claim 7, further including a test pad accessible by an automatic testing device for use in testing the electrical connection.

9. A circuit card, comprising:
   a) a component side for mounting electrical components;
   b) a reverse side being opposite of said component side;
   c) a plurality of thru-holes extending through said card between said component and reverse sides thereof, said thru-holes used to secure said leads of thru-hole components to said circuit card;
   d) a plurality of thru-hole connection pads formed on said circuit card about the periphery of each of said thru-holes, said thru-hole connection pads providing an electrical connection from said component side to said reverse side; and
   e) a plurality of test etches, each test etch being associated with one of said thru-holes, said test etches being positioned within a distance of less than about 0.030 inches of said thru-hole connection pad and used for forming an electrical connection from a component lead soldered to said thru-hole connection pad to said test etch, wherein each of said test etches further comprises a circular ring positioned concentric about said thru-hole connection pads.

10. The circuit card of claim 9, further including a test pad accessible by an automatic testing device for use in testing the electrical connection.

11. A method of inspecting solder joints of thru-hole component leads positioned onto a printed circuit board, said method comprising the steps of:
   (a) inserting the component leads into the printed circuit board through thru-holes, each thru-hole having a connection pad formed about the periphery thereof and associated with a test etch positioned closely thereby and electrically isolated therefrom;
   (b) soldering each lead to its respective thru-hole thereby forming a solder joint bridge between the respective connection pad and test etch, wherein said connection pad is thereby connected to a test pad for use by an automated testing device to test the solder joints; and
   (c) verifying the solder joint of each lead of the thru-hole component by testing the electrical connection between two test pads interconnected by at least one solder bridge to the lead to be tested.

12. The method of claim 6, said circuit card further including a test pad accessible by an automatic testing device for use in testing the electrical connection, further including the step of automatic testing for completion of the electrical connection.

13. An electronic circuit board having conductive traces thereon, for the installation of thru-hole components having leads, comprising:
   a) a plurality of conductive thru-holes positioned on said electronic circuit board, adapted for receiving therein component leads;
   b) a plurality of conductive thru-hole connection pads positioned in close proximity to, and electrically isolated from, said conductive thru-holes, and adapted to permit formation of a solder bridge between said thru-holes and said conductive thru-hole connection pads upon soldering said lead in said thru-hole; and
   c) a plurality of test pads electrically connected to said connection pads, electrically isolated from said thru-holes until said lead is soldered in said thru-hole.

14. The circuit board of claim 13, further including means for verifying the existence of said solder bridges.

15. An electronic circuit board including a plurality of conductive thru-holes, said conductive thru-holes being positioned on said electronic circuit board and adapted for receiving thru-hole component leads; a plurality of conductive thru-hole connection pads electrically connected to said conductive thru-holes, positioned in close proximity to, and electrically isolated from, said thru-holes and further being adapted to permit formation of a solder bridge between a respective thru-hole connection pad and test etch upon soldering said component lead in said thru-hole; and a plurality of test pads electrically connected to said test etches, electrically isolated from said thru-holes until said lead is soldered in said thru-hole for verifying the existence of said solder bridges, said electronic circuit board produced by the process which includes the steps of:
   a) inserting the leads of the thru-hole components into the circuit board thru-holes, each lead being placed into one thru-hole;
   b) soldering lead of the thru-hole component leads to its respective thru-hole thereby forming a solder joint forming a solder bridge between the thru-hole and the test etch wherein said connection pad is connected to a test pad for use by an automated testing device to test the solder joints; and
   c) verifying the solder joint of each thru-hole component lead by testing the electrical connection between two test pads interconnected by a solder bridge to the lead to be tested.

16. A circuit card for mounting thereon electronic components having leads, including a first side; a second side being opposite of said first side; a plurality of thru-holes extending through said card between said first and second sides thereof, said thru-holes being adapted to receive said leads of thru-hole components; a plurality of thru-hole connection pads each being formed on said circuit card about the periphery of one of said thru-holes thereby providing an electrical connection from said first side to said second side; and a plurality of test etches, each test etch being associated with one of said thru-holes, said test etches being positioned within a distance of less than about 0.030 inches of said thru-hole connection pad and initially electrically isolated therefrom and being adapted for forming an electrical connection from a component lead after said lead is soldered to said thru-hole connection pad to electrically connect it to said test etch, said test etch further having a test pad accessible by an automatic testing device for use in testing the electrical connection, wherein said circuit card is produced by the process which includes the steps of:

a) inserting the component leads into the printed circuit board through thru-holes;

b) soldering each component lead to its respective thru-hole thereby forming a solder joint bridge between the connection pad and test etch wherein said connection pad is thereby connected to a test pad for use by an automated testing device to test the solder joints; and c) verifying the solder joint of each lead of the thru-hole component by testing the electrical connection between two test pads interconnected by at least one solder bridge to the lead to be tested.

17. A circuit card for mounting thereon electronic components having leads, comprising:

(a) a first side;

(b) a second side being opposite of said first side;

(c) a plurality of thru-holes extending through said card between said first and second sides thereof, said thru-holes being adapted to secure said component leads to said electronic card;

(d) a plurality of thru-hole connection pads formed on said circuit card about the periphery of each of said thru-holes, said thru-hole connection pads providing an electrical connection from said first side to said second side; and (e) a plurality of test etches, each test etch being associated with a respective one of said thru-holes, said test etches being positioned within a molten solderable distance bridgeable by molten solder surface tension of said respective thru-hole connection pad and initially electrically isolated therefrom and being adapted for forming an electrical connection from a component lead after said lead is soldered to said thru-hole connection pad to electrically connect it to said test etch.

* * * * *